(12) United States Patent
Tsou et al.

(10) Patent No.: US 10,497,690 B2
(45) Date of Patent: Dec. 3, 2019

(54) SEMICONDUCTOR PACKAGE, METHOD FOR FORMING SEMICONDUCTOR PACKAGE, AND METHOD FOR FORMING SEMICONDUCTOR ASSEMBLY

(71) Applicant: TAIWAN SEMICONDUCTOR MANUFACTURING COMPANY LTD., Hsinchu (TW)

(72) Inventors: Hsien-Ju Tsou, Taipei (TW); Chih-Wei Wu, Yilan County (TW); Pu Wang, Hsinchu (TW); Ying-Ching Shih, Hsinchu (TW); Szu-Wei Lu, Hsinchu (TW); Jing-Cheng Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/718,837

(22) Filed: Sep. 28, 2017

(65) Prior Publication Data
US 2019/0096868 A1 Mar. 28, 2019

(51) Int. Cl.
*H01L 25/00* (2006.01)
*H01L 23/498* (2006.01)
(Continued)

(52) U.S. Cl.
CPC ............ *H01L 25/50* (2013.01); *H01L 21/481* (2013.01); *H01L 21/561* (2013.01); *H01L 21/563* (2013.01); *H01L 21/78* (2013.01); *H01L 23/295* (2013.01); *H01L 23/3135* (2013.01); *H01L 23/3737* (2013.01); *H01L 23/49827* (2013.01); *H01L 23/49894* (2013.01); *H01L 23/5383* (2013.01); *H01L 23/5384* (2013.01); *H01L 23/562* (2013.01); *H01L 24/16* (2013.01); *H01L 24/17* (2013.01); *H01L 25/0652* (2013.01);
(Continued)

(58) Field of Classification Search
None
See application file for complete search history.

(56) References Cited

U.S. PATENT DOCUMENTS 8,802,504 B1 8/2014 Hou et al.
8,803,292 B2 8/2014 Chen et al.
(Continued)

*Primary Examiner* — Long Pham
(74) *Attorney, Agent, or Firm* — WPAT, P.C., Intellectual Property Attorneys; Anthony King

(57) ABSTRACT

A semiconductor package includes a first package component include a first side, a second side opposite to the first side, and a plurality of recessed corners over the first side. The semiconductor package further includes a plurality of first stress buffer structures disposed at the recessed corners, and each of the first stress buffer structures has a curved surface. The semiconductor package further includes a second package component connected to the first package component and a plurality of connectors disposed between the first package component and the second package component. The connectors are electrically coupled the first package component and the second package component. The semiconductor package further includes an underfill material between the first package component and the second package component, and at least a portion of the curved surface of the first stress buffer structures is in contact with and embedded in the underfill material.

13 Claims, 13 Drawing Sheets

(51) Int. Cl.

| | | |
|---|---|---|
| *H01L 23/373* | (2006.01) | |
| *H01L 23/29* | (2006.01) | |
| *H01L 23/31* | (2006.01) | |
| *H01L 21/78* | (2006.01) | |
| *H01L 21/56* | (2006.01) | |
| *H01L 25/065* | (2006.01) | |
| *H01L 23/00* | (2006.01) | |
| *H01L 21/48* | (2006.01) | |
| *H01L 23/538* | (2006.01) | |
| *H01L 29/06* | (2006.01) | |

(52) U.S. Cl.
CPC .......... *H01L 25/0657* (2013.01); *H01L 29/06* (2013.01); *H01L 23/3128* (2013.01); *H01L 23/49811* (2013.01); *H01L 25/0655* (2013.01); *H01L 2224/16145* (2013.01); *H01L 2224/16225* (2013.01); *H01L 2224/1703* (2013.01); *H01L 2224/17181* (2013.01); *H01L 2225/06513* (2013.01); *H01L 2225/06517* (2013.01); *H01L 2225/06541* (2013.01); *H01L 2225/06568* (2013.01); *H01L 2924/10156* (2013.01); *H01L 2924/15311* (2013.01); *H01L 2924/18161* (2013.01); *H01L 2924/351* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2009/0160035 A1* | 6/2009 | Suzuki ................ H01L 29/6609 257/623 |

* cited by examiner

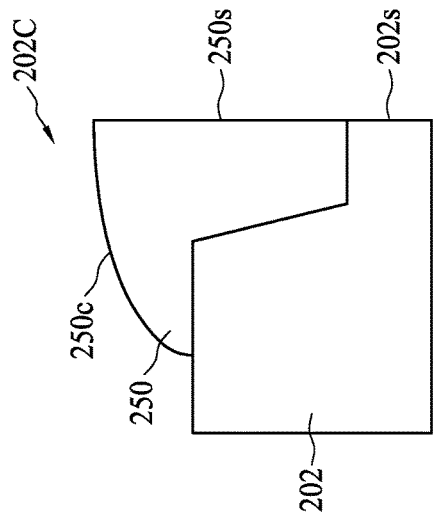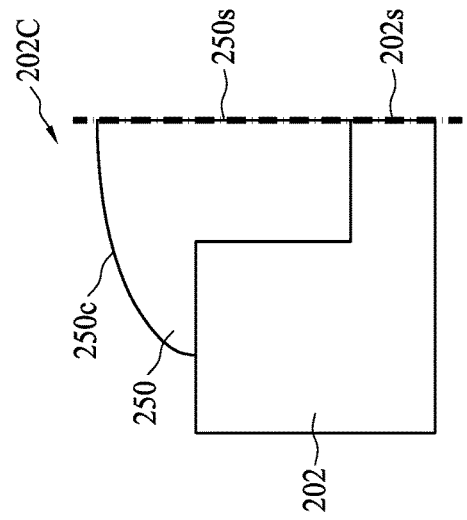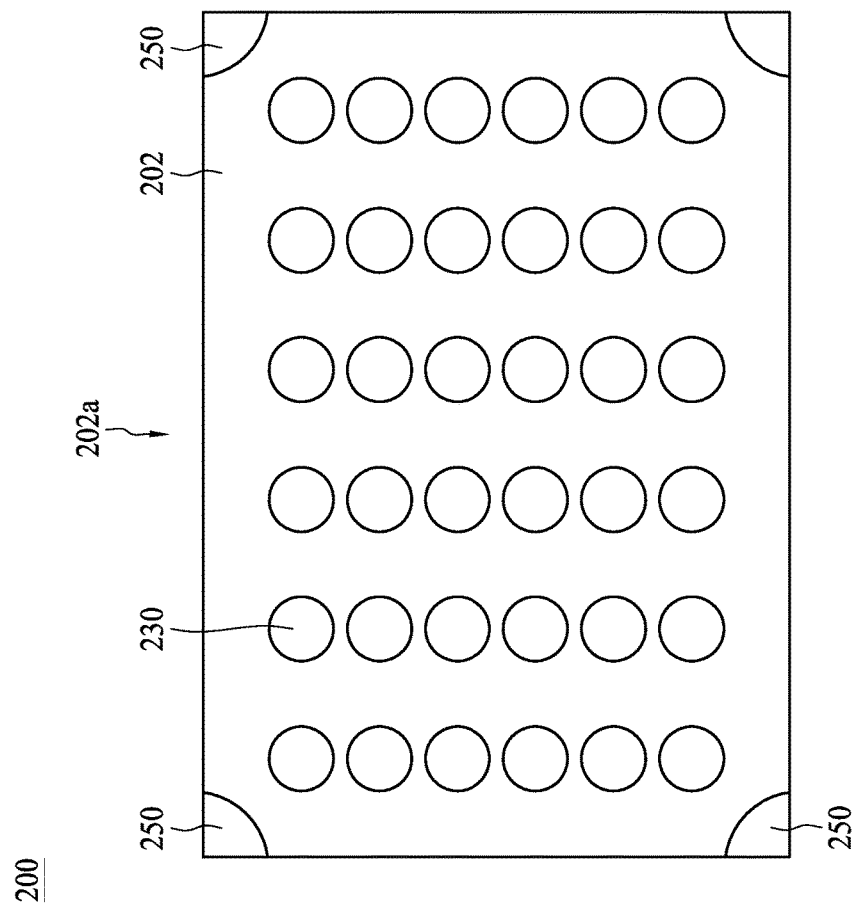

SEMICONDUCTOR PACKAGE, METHOD FOR FORMING SEMICONDUCTOR PACKAGE, AND METHOD FOR FORMING SEMICONDUCTOR ASSEMBLY

BACKGROUND

A significant trend throughout integrated circuit (IC) development is the downsizing of IC components. These integration improvements are two-dimensional (2D) in nature where the ICs are integrated on a surface of a semiconductor wafer. Although dramatic improvement in lithography has enabled greater results in 2D IC formation, there are physical limits to the density that can be achieved in two dimensions. Also, when more devices are put into one chip, more complex designs and more costs are required.

In an attempt to further increased circuit density, three-dimension (3D) ICs have been developed. For example, two dies are boned together; and electrical connections are constructed between each die. The stacked dies are then bonded to a carrier substrate by using wire bonds and/or conductive pads. In another example, a chip on chip-on-substrate (Co(CoS)) or chip-on wafer on substrate (CoWoS) technique is developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 7C illustrate a semiconductor assembly at various fabrication stages constructed according to aspects of the present disclosure in one or more embodiments.

DETAILED DESCRIPTION

Figure 1:
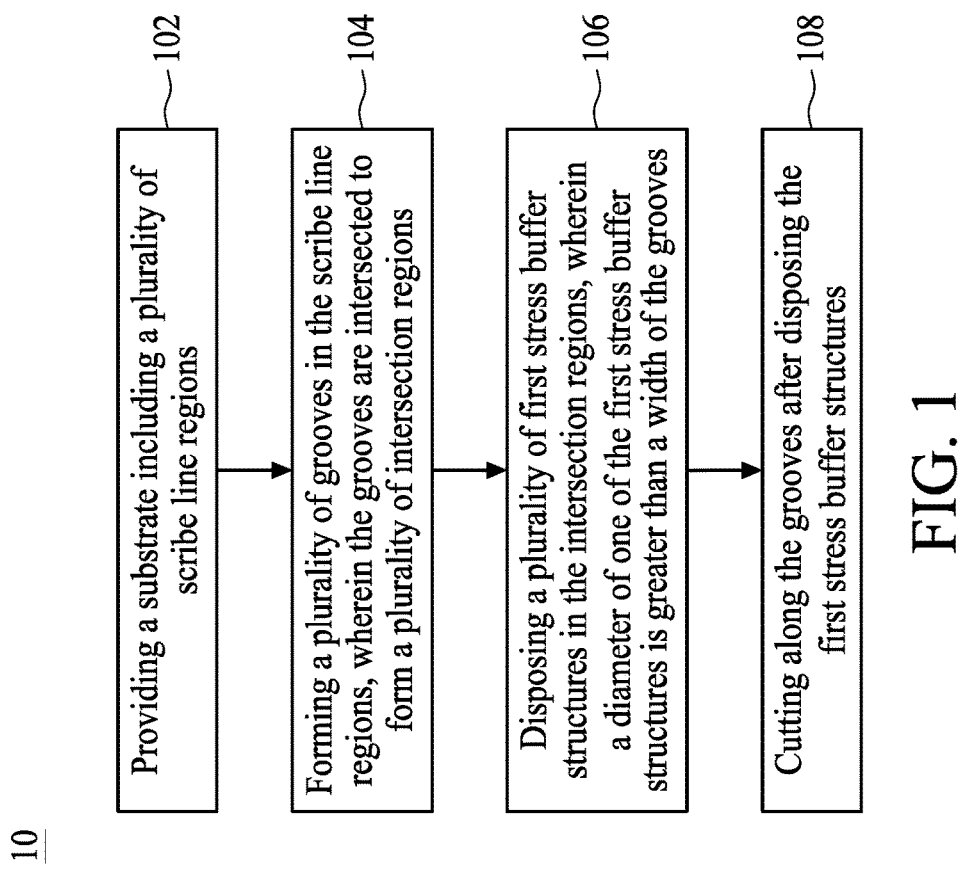
FIG. 1 shows a flow chart representing a method for forming a semiconductor assembly according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A current common requirement for an advanced electronic circuit is the use of multiple integrated circuit devices ("dies") integrated in a single packaged component. As such, the configuration of a 3D package is developed as; for example, CoCoS or CoWoS techniques. The integrated circuit dies with different functions are mounted to a wafer by using conductive bumps, such as micro bumps. A thermal reflow step is performed to complete the mechanical and electrical connection between the dies and the wafer by melting and reflowing the conductive bumps. In addition, the integrated circuit dies are coupled with conductive bumps at the opposite side of the wafer by through substrate vias. The conductive bumps at the opposite side of the wafer are larger than the conductive bumps between the IC dies and the wafer. Usually, those conductive bumps are referred to "ball grid array" or controlled collapse chip connection (C4) bumps. After the IC dies are mounted to the wafer and the C4 bumps are prepared, a singulation operation is performed on the wafer to form pieces of interposers stacked with the IC dies. During the singulation operation, the interposers are diced as rectangular shapes with edges and corners. Later, the interposers are mounted on a circuit board by using the C4 bumps. The IC dies thus are able to receive and transmit signals from outer devices by the chip-on-wafer-on-substrate package.

However, since there is a thermal mismatch between the interposer and the circuit board, it is found that the interposer may suffer cracks caused by the physical stress due to coefficients of thermal expansion (CTEs) mismatch and warpage mismatch. It is further observed that the corners and/or edges where the interposer contacting the underfill material acts as crack initial points. Sometimes, the underfill material immediately adjacent to the corners/edges also suffers from the stress, thus causing an underfill delamination from the crack initial points.

The present disclosure provides a semiconductor package, a method for forming a semiconductor package, and a method for forming a semiconductor assembly to protect the semiconductor package from crack issue during thermal cycling and/or reliability stressing.

FIG. 1 is a flow chart representing a method for forming a semiconductor assembly 10 according to aspects of the present disclosure. The method for forming the semiconductor assembly 10 includes an operation 102, providing a substrate including a plurality of scribe line regions. The method for forming the semiconductor assembly 10 further includes an operation 104, forming a plurality of grooves in the scribe line regions. The grooves are intersected to form a plurality of intersection regions. The method for forming the semiconductor assembly 10 further includes an operation 106, disposing a plurality of first stress buffer structures in the intersection regions. A diameter of one of the first stress buffer structures is greater than a width of the grooves. The method for forming the semiconductor assembly 10 further includes an operation 108, cutting along the grooves after disposing the first stress buffer structures. The method for forming the semiconductor assembly 10 will be further described according to one or more embodiments. It should be noted that the operations of the method for forming the semiconductor assembly 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2:
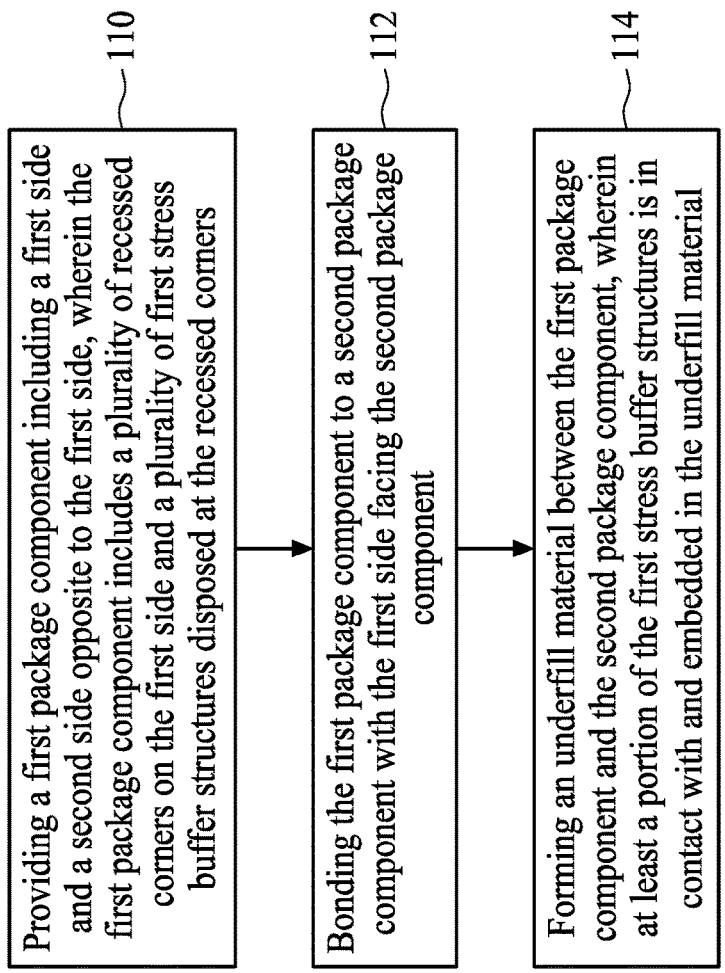
FIG. 2 shows a flow chart representing a method for forming a semiconductor package according to aspects of the present disclosure.

FIG. 2 is a flow chart representing a method for forming a semiconductor package 11 according to aspects of the present disclosure. In some embodiments of the present disclosure, the method for forming the semiconductor package 11 can be performed after the method for forming the semiconductor assembly 10, but not limited to this. The method for forming the semiconductor package 11 includes an operation 110, providing a first package component including a first side and a second side opposite to the first side. The first package component includes a plurality of recessed corners on the first side and a plurality of first stress buffer structures disposed at the recessed corners. The method for forming the semiconductor package 11 further includes an operation 112, bonding the first package component to a second package component with the first side facing the second package component. The method for forming the semiconductor package 11 further includes an operation 114, forming an underfill material between the first package component and the second package component. At least a portion of the first stress buffer structures is in contact with and embedded in the underfill material. The method for forming the semiconductor package 11 will be further described according to one or more embodiments. It should be noted that the operations of the method for forming the semiconductor package 11 may be rearranged or otherwise modified within the scope of the various aspects. It is further noted that additional processes may be provided before, during, and after the method 11, and that some other processes may only be briefly described herein. Thus other implementations are possible within the scope of the various aspects described herein.

Figure 3A:
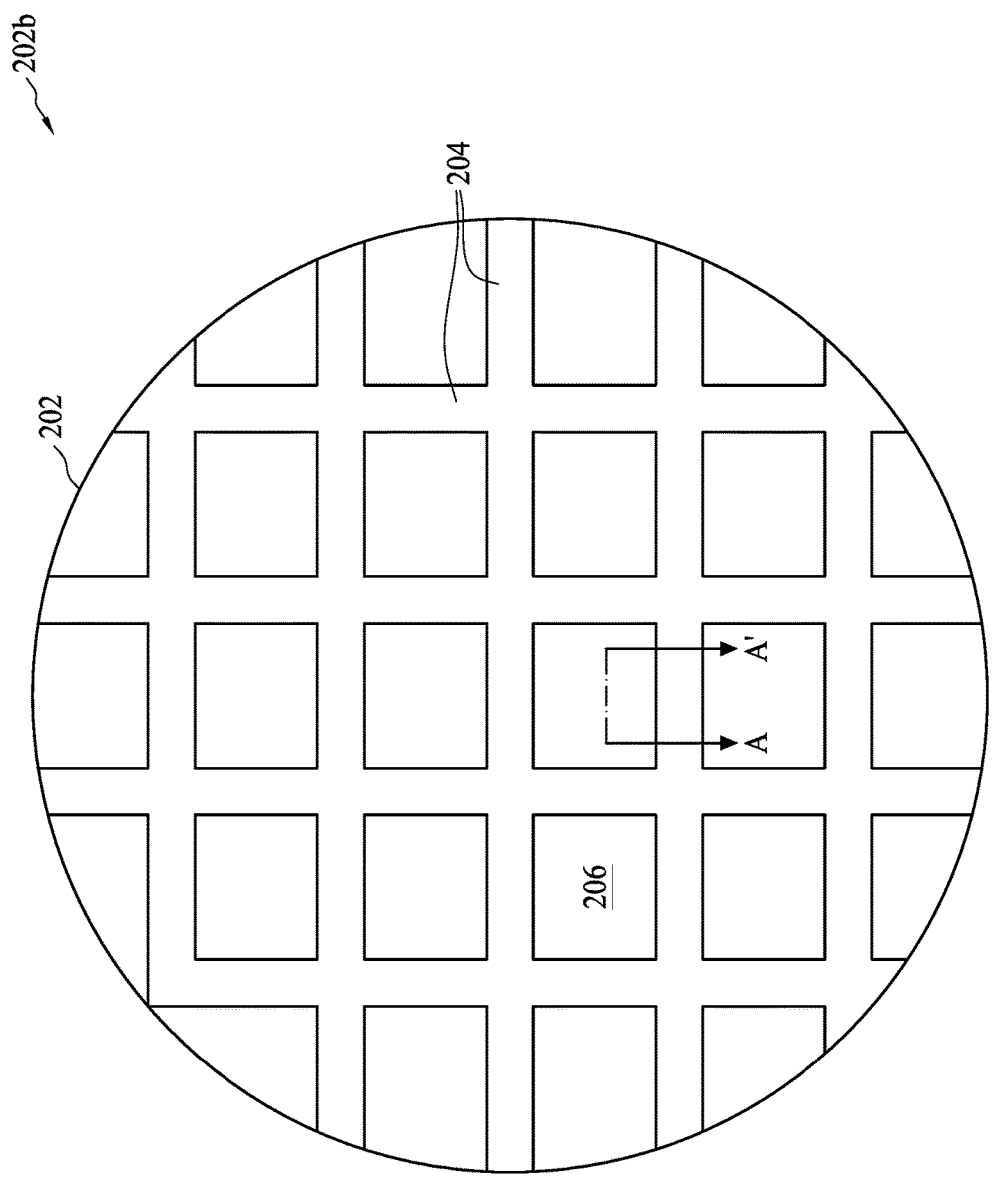

FIG. 3A through FIG. 7C are drawings illustrating a semiconductor assembly at various fabrication stages constructed according to aspects of the present disclosure in one or more embodiments. FIG. 3A is a plan view and FIG. 3B is a cross-sectional view along A-A' line of FIG. 3A. Referring to FIGS. 3A and 3B, a substrate 202 is provided according to operation 102. In some embodiments of the present disclosure, the substrate 202 is a semiconductor wafer including a plurality of scribe line regions 204 and a plurality of chip regions 206 defined by the scribe line regions 204. In some embodiments, the chip regions 206 are arranged in an array separated from each other by the intersecting scribe line regions 204. In some embodiments, a width of the scribe line regions 204 can between substantially 100 micrometers (μm) and substantially 500 μm, but not limited to this. In accordance with some embodiments of the present disclosure, structure formed on the chip regions 206 are described in detail below.

Figure 3B:
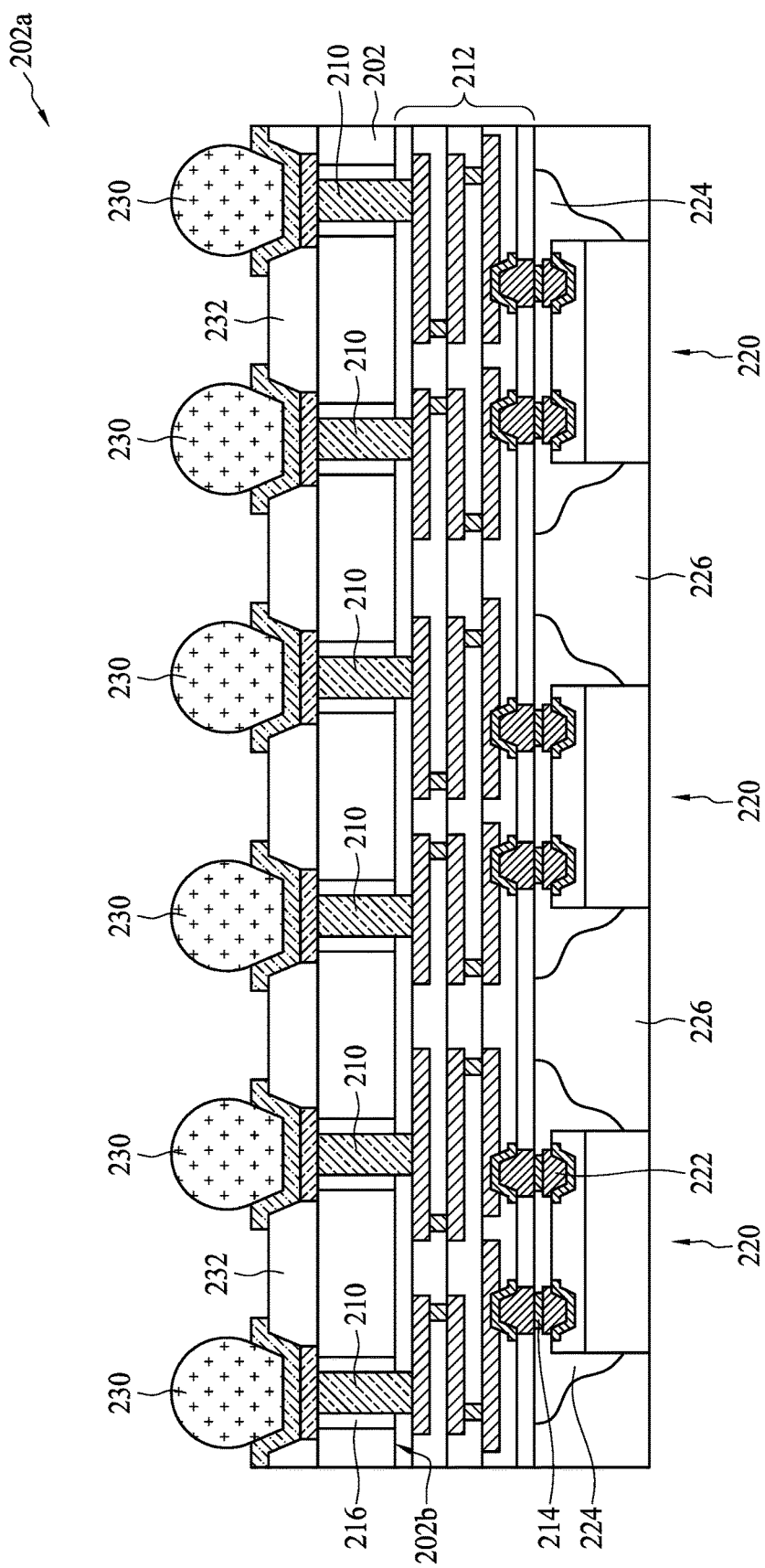

Please refer to FIG. 3B. In some embodiments, the substrate 202 includes a semiconductor material such as silicon (Si), germanium (Ge), diamond, or the like. In other embodiments, the substrate 202 can include compound materials such as SiGe, silicon carbide (SiC), gallium arsenic (GaAs), indium arsenide (InAs), indium phosphide (InP), silicon germanium carbide SiGeC, gallium indium phosphide (GaInP), combination of these, or the like. Additionally, the substrate 202 can be a silicon-on-insulator (SOI) substrate. The substrate 202 may include active and passive devices (not shown). As one of ordinary skilled in the art will recognize, a wide variety of devices such as transistors, capacitors, resistors, combination of these, and the like may be used to form the structural and functional requirements of the design for one or more dies. The devices may be formed using any suitable methods. In some embodiments of the present disclosure, the substrate 202 is an interposer that generally includes no active devices therein, although the interposer may include passive devices.

Referring to FIG. 3B, semiconductor operations are performed to the semiconductor wafer to form through-substrate vias (TSVs) 210 in the substrate 202, an interconnect structure 212 over a surface 202b of the substrate 202, and a plurality of connectors 214 over the surface 202b of the substrate 202. As shown in FIG. 3B, the TSVs 210 are conductive vias extending from the surface 202b of the substrate 202 into a depth of the substrate 202. In some embodiments, the TSVs 210 include a metal via, and a barrier layer lining the sidewalls of the metal via. The metal via may be formed of copper (Cu), copper alloy, tungsten (W), tungsten alloy, or the like. The barrier layer (not shown) functions as a diffusion barrier and may be formed of refractory metals, refractory metal-nitride, refractory metal silicon-nitrides, and combination thereof. For example but not limited to, tantalum (Ta), tantalum nitride (TaN), titanium (Ti), titanium nitride (TiN), titanium silicon nitride (TiSiN), tungsten nitride (WN), or combination thereof may be used. In some embodiments, an insulating layer 216 is formed between the TSVs 210 and the substrate 202 so as to isolate the TSVs 210 from other connections formed in the substrate 202.

The interconnect structure 212, sometimes referred to as redistribution layer (RDL), is formed over the surface 202b of the substrate 202, and is electrically coupled to the TSVs 210 and electrical circuitry formed in the substrate 202. The interconnect structure 212 include a plurality of dielectric layers, conductive lines, and vias. The dielectric layers may include silicon oxide (SiO), silicon nitride (SiN), silicon carbide (SiC), silicon oxynitride (SiON), low-k dielectric materials such as borophosphosilicate glass (BPSG), fused silica glass (FSG), silicon oxycarbide (SiOC), spin-on-polymers, silicon carbon material, compound thereof, compositions thereof, combinations thereof, or the like. The conductive lines are formed in the dielectric layers, and the conductive lines formed in one same dielectric layer are in combination referred to as a conductive layer. The vias are formed between and to electrically couple the conductive lines of different conductive layers. The conductive lines and the vias may include Cu, W, aluminum (Al), combination thereof, or the like.

The connectors 214 are formed over and electrically coupled to the interconnect structures 212. The connectors 214 may be solder balls, metal pillars, micro bumps, electroless nickel-electroless palladium-immersion gold technique (ENEPIG) formed bumps, or the like. The connectors 214 may include conductive material(s) such as solder, Cu, Al, gold (Au), nickel (Ni), silver (Ag), palladium (Pd), tin (Sn), combination thereof, or the like.

Still referring to FIG. 3B, at least one or more semiconductor devices 220 can be formed over the surface 202b of the substrate 202. In some embodiments of the present disclosure, the semiconductor devices 220 can be dies 220, and the dies 220 are bonded to the chip regions 206 of the substrate 202. The dies 220 may include a logic die, such as a central processing unit (CPU), a graphics processing unit (GPU), a combination of these, or the like. The dies 220 may include a memory die, such as a DRAM die, a SRAM die, a combination of these, or the like. In some embodiments, the dies 220 may include an input/output (I/O) die, such as a wide I/O die. In some embodiments, the dies 220 bonded to the substrate 202 can be the same type of dies. For example but not limited to, the dies 220 bonded to the substrate 202 as shown in FIG. 3B can be all DRAM dies. Still in some embodiments, the dies 220 bonded to the substrate 202 can be different types of dies. For example but not limited to, the dies 220 bonded to the substrate 202 as shown in FIG. 3B can be logic die(s) and memory die(s). In some embodiments of the present disclosure, the dies 220 include a die stack (not shown) which may include both logic and memory dies. Any suitable combination of semiconductor dies and any number of semiconductor dies may be alternatively adopted, and all such numbers, combinations, and functionalities are fully intended to be included within the scope of the present disclosure.

In some embodiments of the present disclosure, the semiconductor devices 220 are bonded to the substrate 202 through, for example but not limited to, flip-chip bonding, in which connectors 222 of the semiconductor devices 220 are bonded to the connectors 214 of the substrate 202. As shown in FIG. 3B, underfill materials 224 are then dispensed into the space between the semiconductor devices 220 and the substrate 202 and to surround the connectors 222/214. The underfill materials 224 may include, for example but not limited to, a liquid epoxy, deformable gel, silicon rubber, or the like. And then the underfill materials 224 are cured to harden to reduce damage to and to protect the connectors 222/214. Next, a molding compound 226 is molded on the semiconductor devices 220. In some embodiments, the molding compound 226 includes a polymer, an epoxy, SiO filler material, a combination thereof, or the like. In some embodiments, the semiconductor devices 220 are buried in the molding compound 226, and a planarization operation can be performed after curing the molding compound 226. The planarization operation is performed to provide a substantially planar top surface and expose top surfaces of the semiconductor devices 220, as shown in FIG. 3B.

Still referring to FIG. 3B, a plurality of connectors 230 is disposed in each chip region 206. The connectors 230 are disposed on a surface 202a opposite to the surface 202b. In some embodiments of the present disclosure, a thinning operation is performed to thin down the substrate 202 from the surface 202a until the TSVs 210 are exposed. And a dielectric layer 232 can be formed over the surface 202a of the substrate 202. Next, the connectors 230 are formed over the dielectric layer 232 and electrically coupled to the TSVs 210, as shown in FIG. 3B. The connectors 230 can be solder balls, metal pillars, C4 bumps, micro bumps, ENEPIG formed bumps, or the like. The connectors 230 may include solder, Cu, Al, Au, Ni, Ag, Pd, Sn, combination thereof, or the like.

Figure 4B:
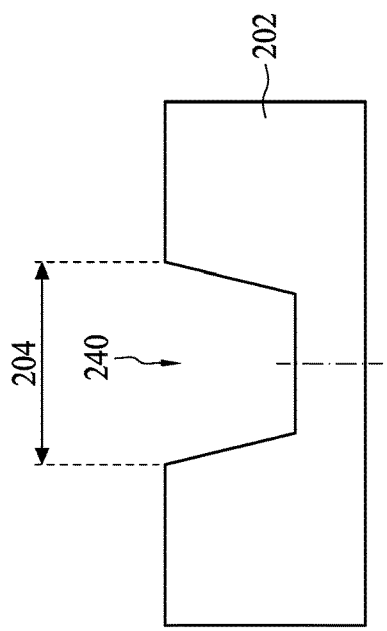
Figure 4C:
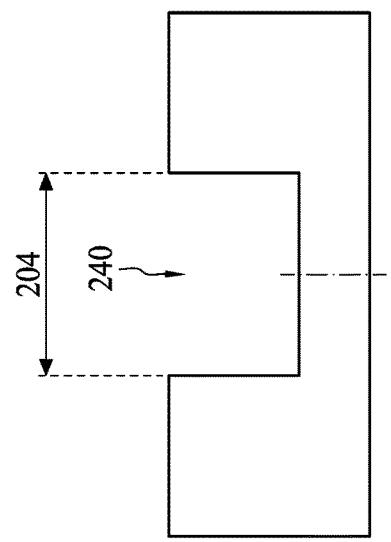
Figure 4A:
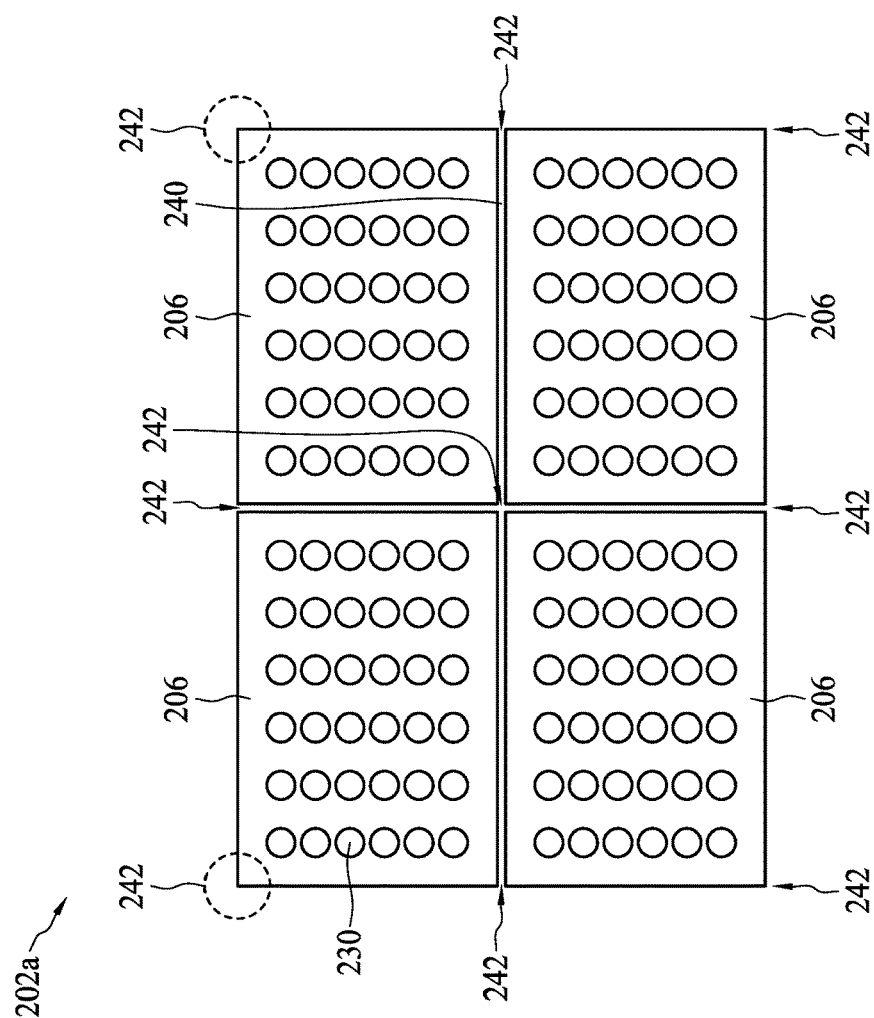

FIG. 4A is a bottom view of the substrate 202, over which the connectors 230 are formed and arranged in an array in each chip region 206 at the surface 202a. As mentioned above, the chip regions 206 are separated from each other by the intersecting scribe line regions 204. In some embodiments of the present disclosure, a plurality of grooves 240 is formed in the scribe line regions 204 according to operation 104. The grooves 240 can be formed over the surface 202a in a continuous manner on the scribe line regions 204, such that the planar layout of the grooves 240 is substantially similar to that of the scribe line regions 204. Accordingly, the grooves 240 are intersected to form a plurality of intersection regions 242. In some embodiments, since the neighboring chip regions 206 are separated by the grooves 240 on the scribe line regions 204, the intersection regions 242 are adjacent to four corners of four different chip regions 206, as shown in FIG. 4A. In some embodiments, the grooves 240 can be formed in a discontinuous manner, however the grooves 240 are still intersected to form the intersection regions 242. In some embodiments of the present disclosure, the grooves 240 can be formed by using laser cutting, laser micro jet cutting, bevel cutting, blade sawing, or the like. In some embodiments, when bevel cutting is employed, the grooves 240 may include slanted sidewalls as shown in FIG. 4B, which is an enlarged view of the groove 240. In some embodiments, when a 2-step cutting is employed, the grooves 240 may include vertical sidewalls as shown in FIG. 4C, which is an enlarged view of the groove 240. In still some embodiments, the grooves 240 may include curved sidewalls. Additionally, the sidewalls of the grooves 240 may have smooth or rough surfaces depending on the cutting method employed to form the grooves 240.

Figure 5B:
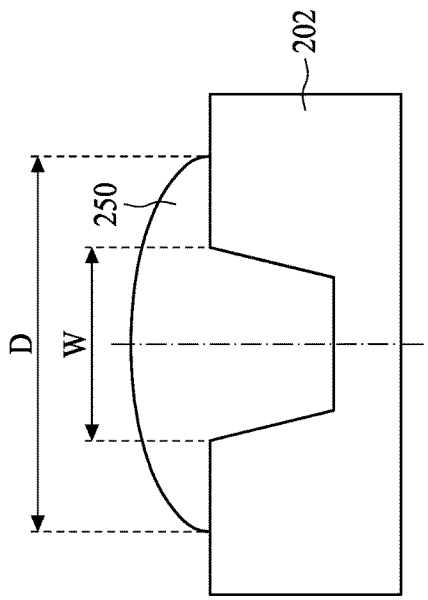
Figure 5C:
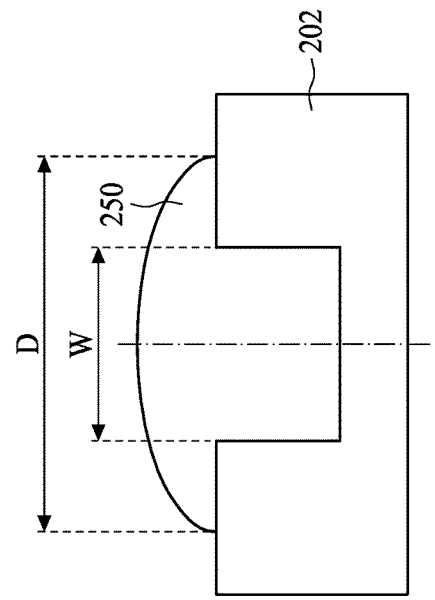
Figure 5A:
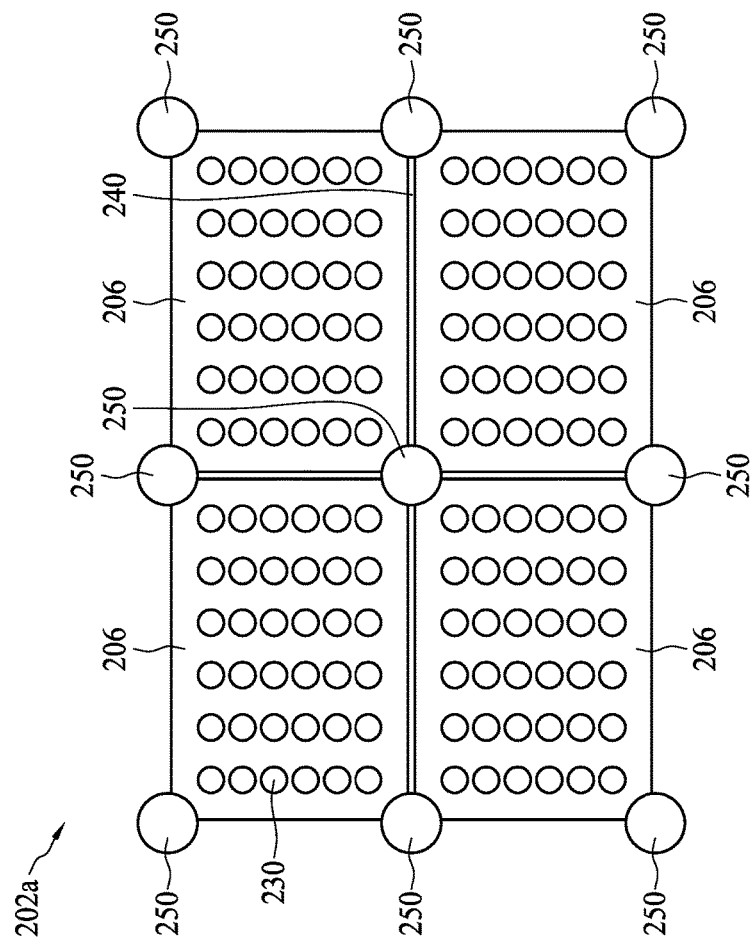

Referring to FIGS. 5A-5C, a plurality of first stress buffer structures 250 is formed in the intersection regions 242 over the surface 202a according to operation 106. In other words, each first stress buffer structure 250 is accommodated in each intersection region 242. In some embodiments of the present disclosure, the first stress buffer structures 250 can be formed by disposing a plurality of polymer materials over the intersection regions 242. As shown in FIGS. 5A-5C, the intersection regions 242 of the grooves are filled with the polymer materials. Furthermore, the polymer materials may overflow the intersection regions 242. Thus, a diameter D of one of the first stress buffer structures 250 is greater than a width W of the grooves 240 after curing the polymer materials to form the first stress buffer structures 250 as shown in FIGS. 5A-5C. And the first stress buffer structures 250 may have a curved surface, respectively. In some embodiments, the first stress buffer structures 250 can include epoxy-based materials without fillers. In some embodiments, the first stress buffer structures 250 can include fillers in the epoxy-based materials. As shown in FIG. 5A, the first stress buffer structures 250 are spaced apart from the connectors 230. Furthermore, the first stress buffer structures 250 are spaced apart from each other, as shown in FIG. 5A.

Figure 6:
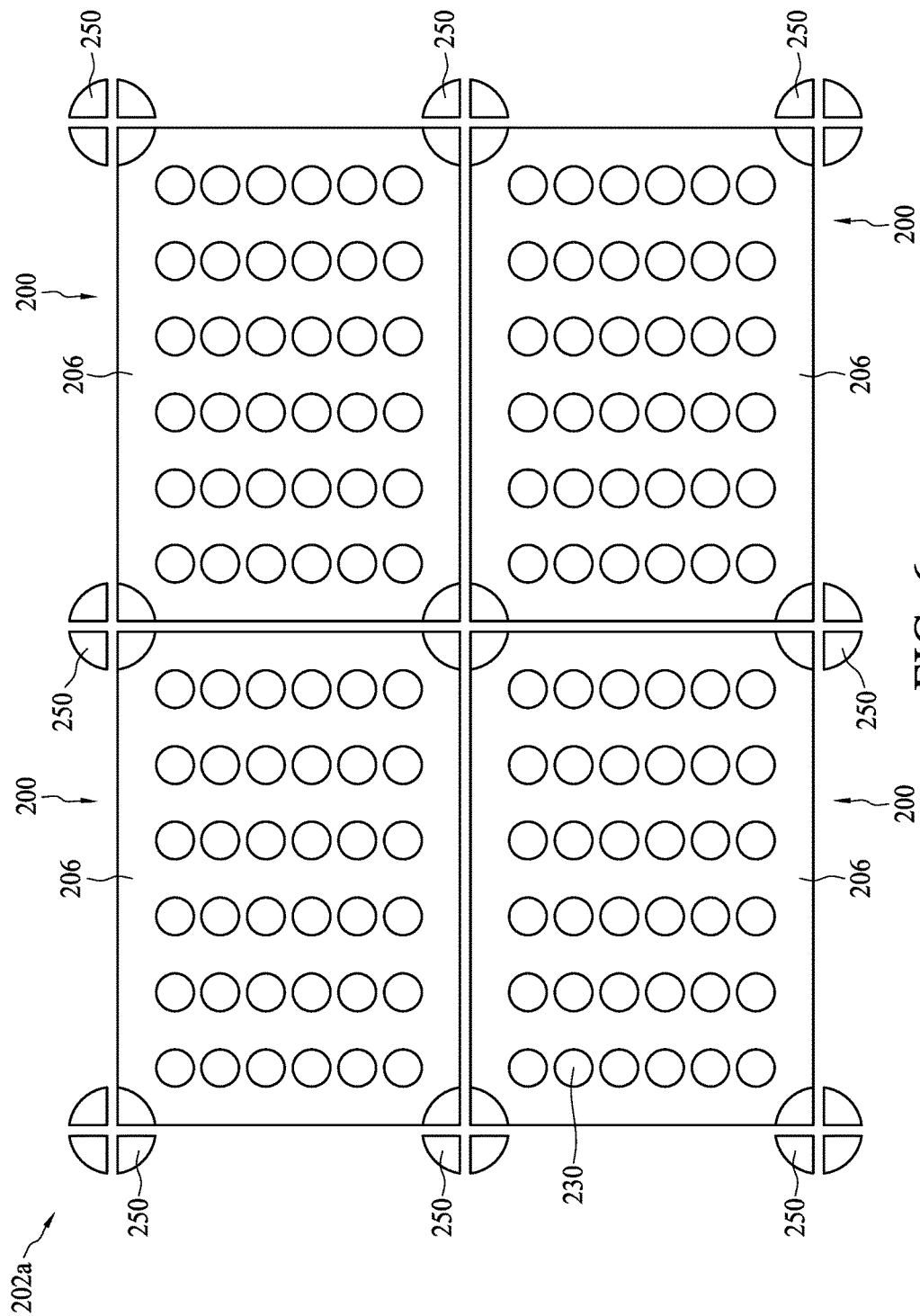

Referring to FIG. 6, after disposing the first stress buffer structures 250, the substrate 202 is cut along the grooves 240 from the surface 202a according to operation 108. Accordingly, the chip regions 206 of the substrate 202 are diced into a plurality of semiconductor assembly 200, such as interposer chips. In some embodiments of the present disclosure, sine the individual semiconductor assemblies 200 include the die(s) 220 bonded to the interposer substrate 202, the semiconductor assemblies 200 can be referred to as die-on-interposer package components. In some embodiments, each of the first stress buffer structures 250 is cut into four portions remaining at the four corners of the substrate 202.

Referring to FIGS. 7A-7C, the individual semiconductor assembly 200 includes a first side 200a and a second side 200b (shown in FIG. 8) opposite to the first side 200a. More importantly, the semiconductor assembly 200 includes a plurality of recessed corners 202C on the first side 202a. Each of the recessed corners 202C is a part of the intersection region 242. The semiconductor assembly 200 further includes the plurality of first stress buffer structures 250 disposed at the recessed corners 202C. As shown in FIGS. 7B-7C, the first stress buffer structures 250 respectively have a curved surface 250c. Additionally, each of the first stress buffer structures 250 includes two vertical sidewalls 250s substantially align to corner sidewalls 202s of the semiconductor assembly 200, as shown in FIGS. 7B-7C.

Figure 8:
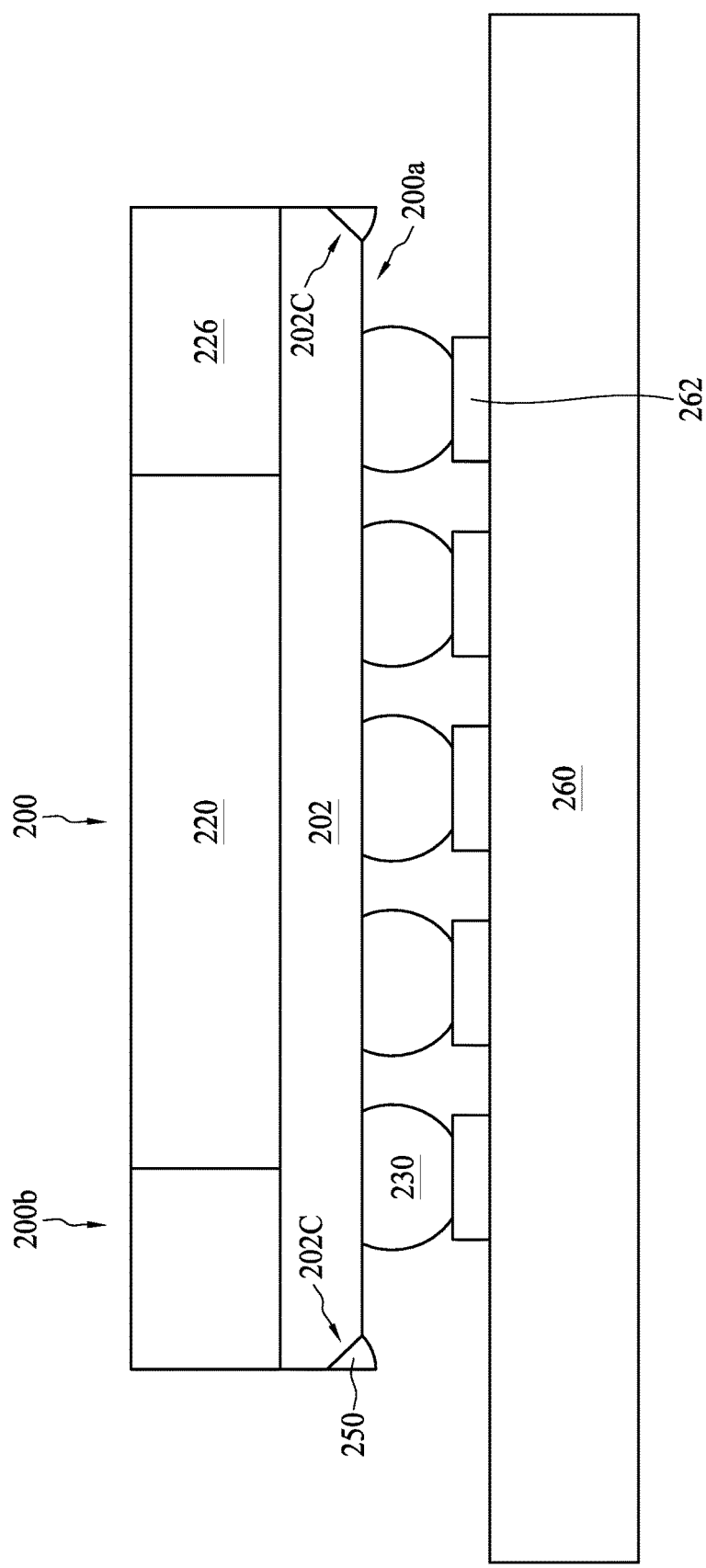
FIGS. 8 through 9 illustrate a semiconductor package at various fabrication stages constructed according to aspects of the present disclosure in one or more embodiments.
Figure 9:
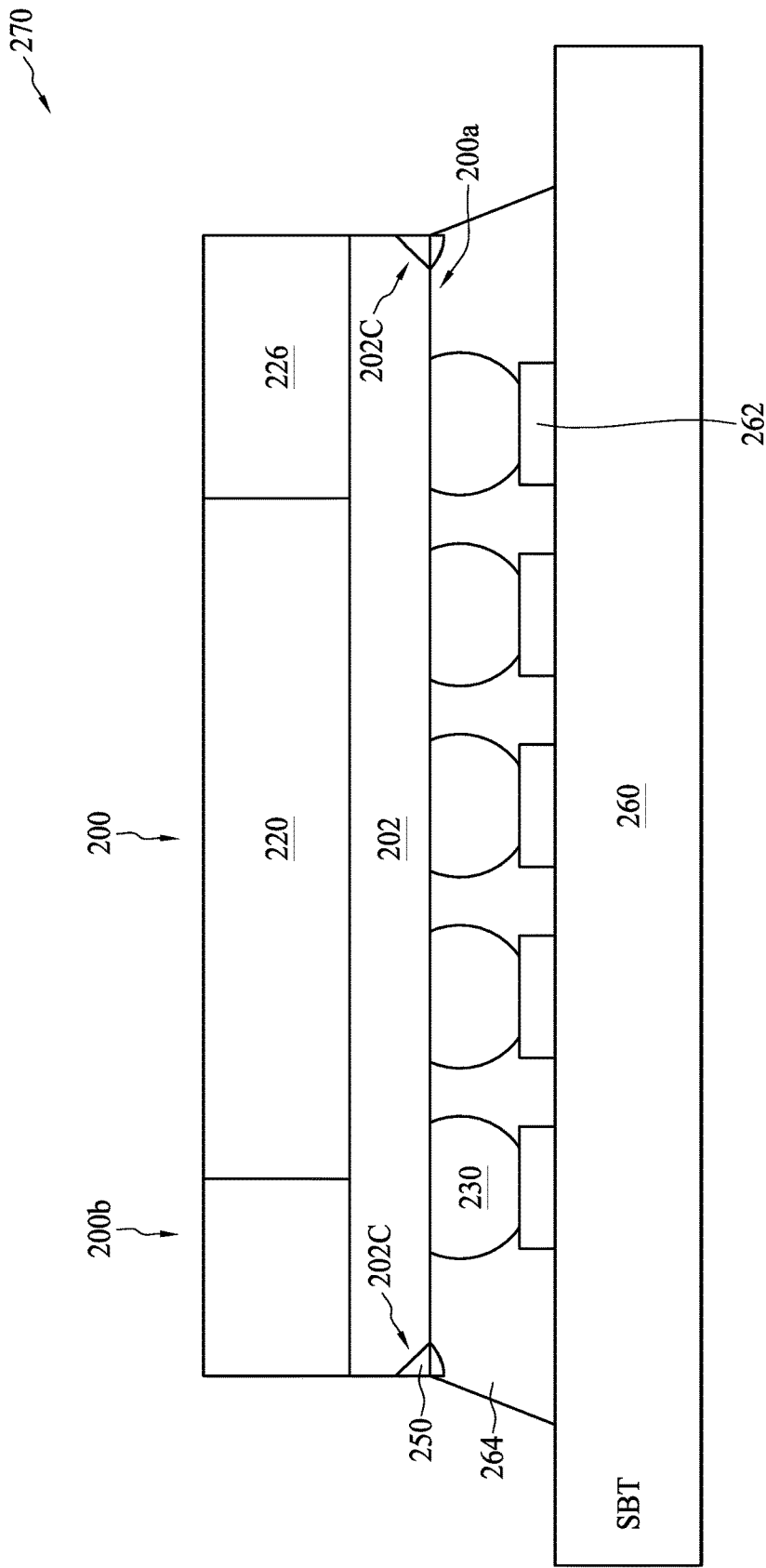

FIGS. 8-9 are drawings illustrating a semiconductor package at various fabrication stages constructed according to aspects of the present disclosure in one or more embodiments. Referring to FIG. 8, a first package component is provided according to operation 110. The first package component can be the semiconductor assembly 200 formed by performing the abovementioned operations 102-108, but not limited to this. It should be understood that the TSVs 210, the interconnection structure 212, the connectors 214/222, and the underfill materials 224 are all omitted in the interest of brevity, and only one semiconductor device 220 is shown in FIG. 8, but those skilled in the art would easily realize the formation and locations of those elements and any other required elements according to the aforementioned description. The first package component 200 includes the first side 200a and the second side 200b opposite to the first side. More importantly, the first package component 200 includes the recessed corners 202C and the plurality of first stress buffer structures 250 disposed at the recessed corners 202C. In some embodiments of the present disclosure, a second package component 260 is provided. The second package component 260 can be an organic substrate, a circuit board, a dielectric substrate, or a semiconductor substrate with high-density interconnects. In some embodiments, the substrate of the second package component 260 can be printed circuit board (PCB) made of fiber-glass or similar material and including electrical wires printed onto the board for connecting various components and packages. The second package component 260 can include a plurality of connectors 262 formed over the substrate. The connectors 262 can include Cu, Cu alloy, Sn, Sn alloy, Au, Ni, Pd, combination thereof, or the like. Referring to FIG. 8, the first package component 200 is bonded to the second package component 260 with the first side 200a facing the second package component 260 according to operation 112. Such that the second package component 260 is electrically coupled to the first package component 200 through the connectors 230 and the connectors 262. In some embodiments of the present disclosure, since the height of the first stress buffer structures 250 is less than the height of the connectors 230, the first stress buffer structures 250 are spaced apart from the second package component 260 as shown in FIG. 8.

Referring to FIG. 9, an underfill material 264 is formed between the first package component 200 and the second package component 260 according to operation 114. Accordingly, a semiconductor package 270 is obtained. The underfill material 264 may include, for example but not limited to, a liquid epoxy, deformable gel, silicon rubber, or the like, that is dispensed between the first package component 200 and the second package component 260 and then cured to harden. In some embodiments of the present disclosure, the underfill material 264 includes fillers. The underfill material 264 is used to reduce damage to and to protect the electrical connectors 230/262. In some embodiments, at least a portion of the first stress buffer structures 250 is in contact with and embedded in the underfill material 264. It can be understood that when the first stress buffer structures 250 includes no fillers while the underfill material 264 includes the fillers, at least a portion of the curved surface of the first stress buffer structures 250 is in contact with and embedded in the underfill material 264. It can be understood that when both of the first stress buffer structures 250 and the underfill material 264 include the fillers, the first stress buffer structures 250 and the underfill material 264 are taken as a continuous structures including merged two portions. And it can be referred that such continuous structures between the first package component 200 and the second package component 260 covers the recessed corners 202C of the first package component 200.

It is found that a thermal mismatch and/or warpage mismatch between the substrate 202 and the second package component 260 may generate, and thus the semiconductor package 270 may suffer physical stress during thermal cycling and/or reliability stressing. Furthermore, it is further observed that the corners often act as crack initial points. By providing the first stress buffer structures 250 at the recessed corners 202C of the first package component 200, the stress is buffered, the crack initial point is eliminated, and thus the crack and delamination issues are mitigated.

Figure 10:
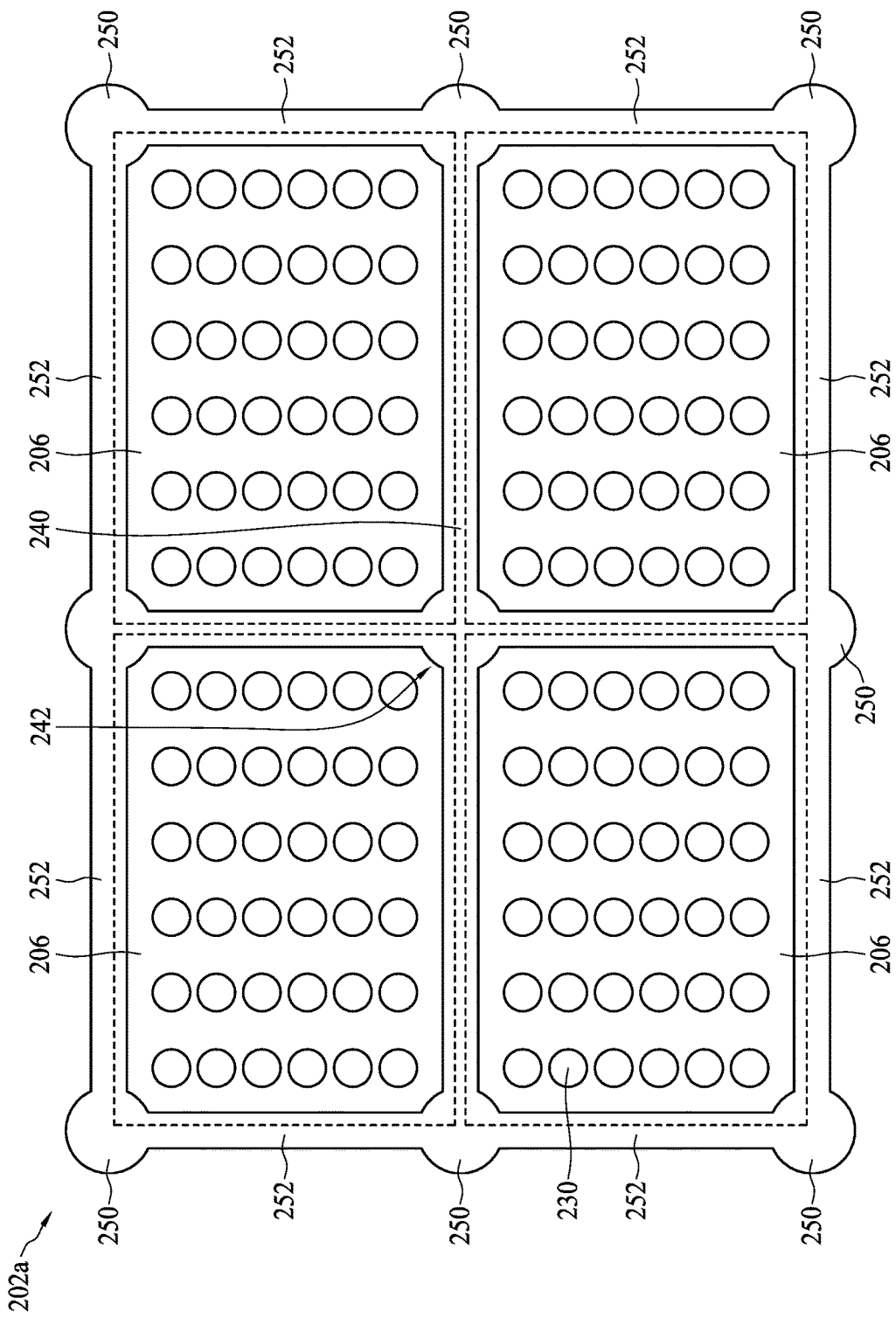
FIGS. 10 through 12 illustrate a semiconductor package at various fabrication stages constructed according to aspects of the present disclosure in one or more embodiments.
Figure 11:
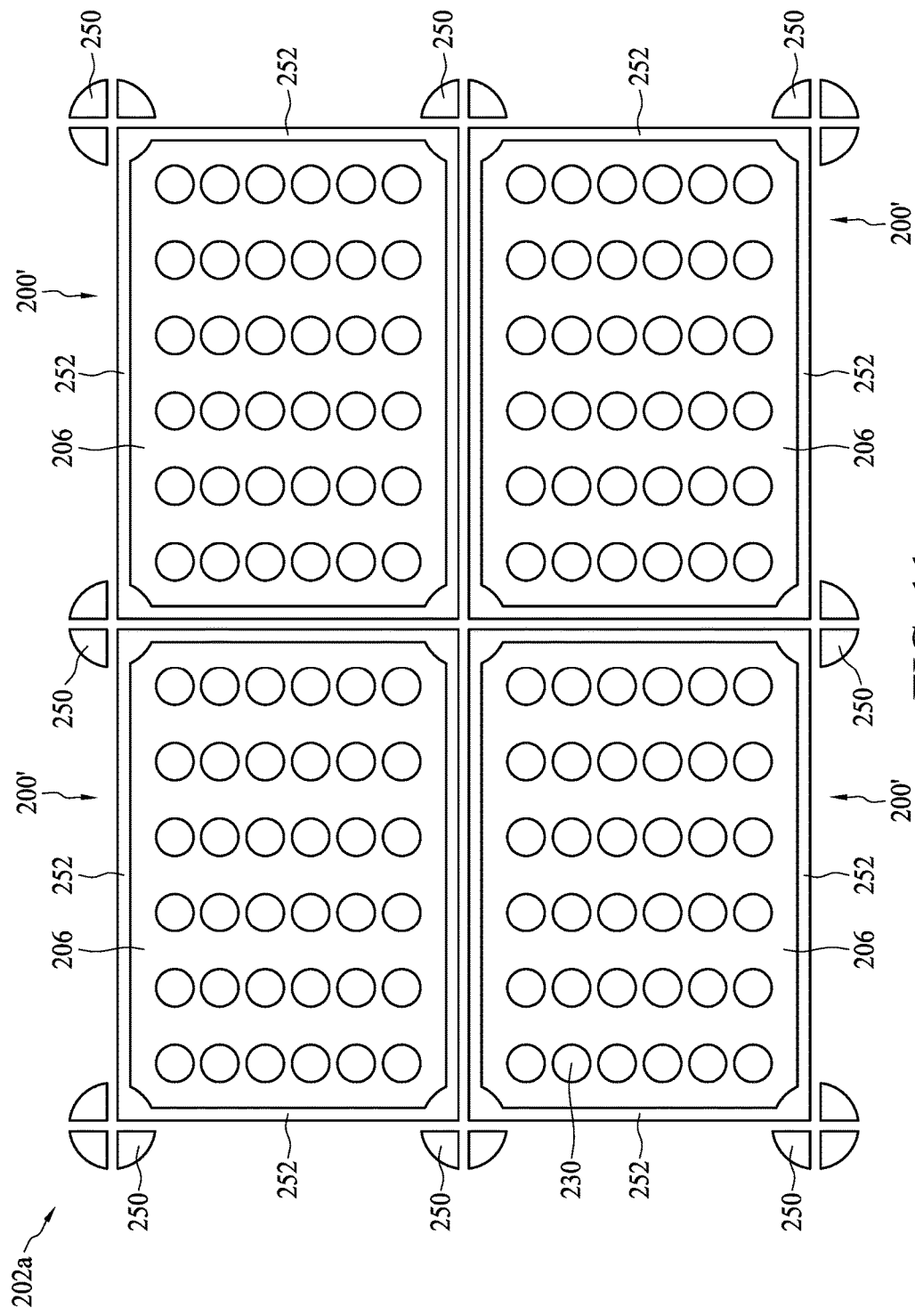
Figure 12:
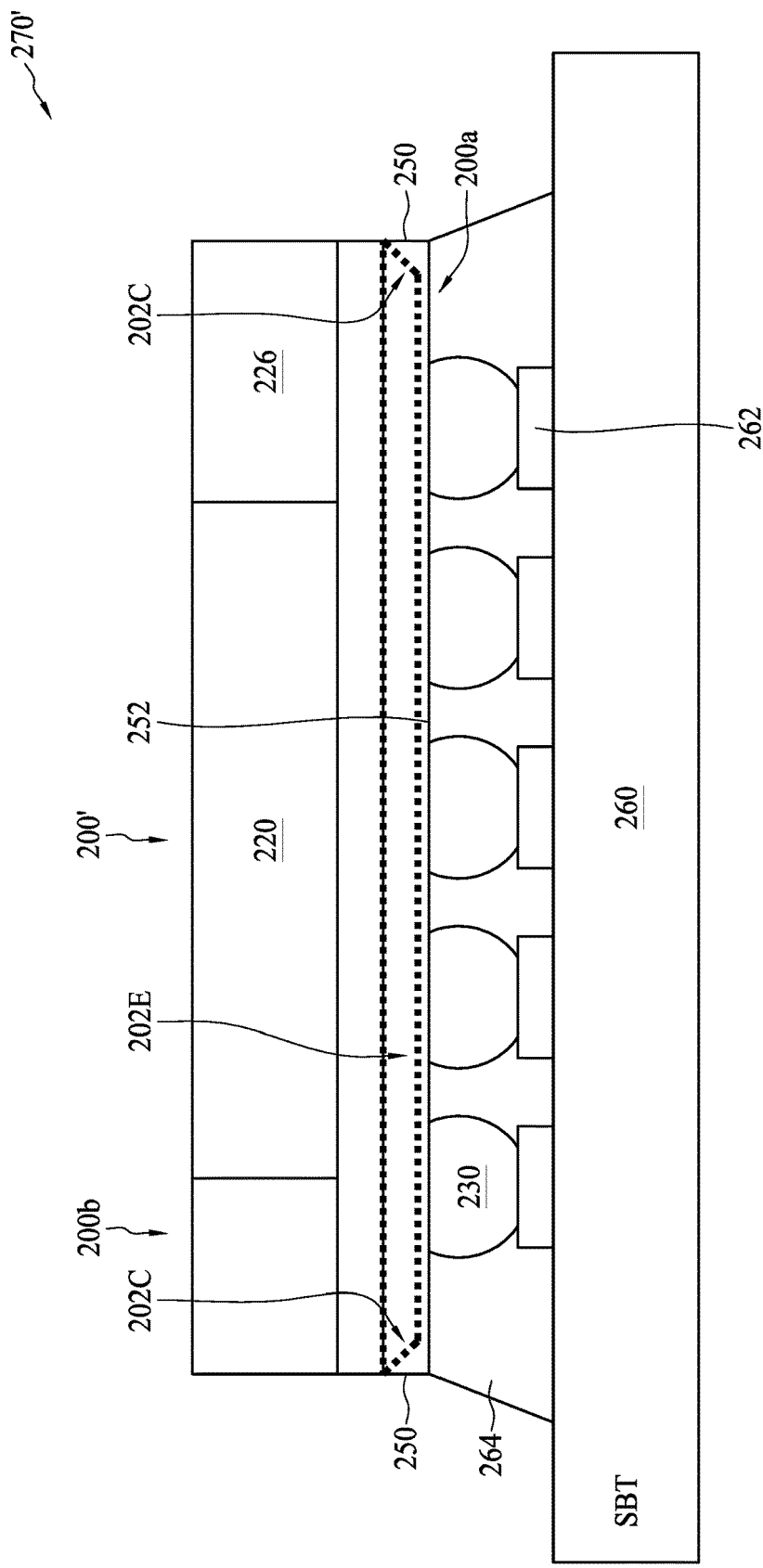

Please refer to FIGS. 10-12, which are schematic drawings illustrating a semiconductor package at various fabrication stages constructed according to aspects of the present disclosure in one or more embodiments. It should be understood that similar features in FIGS. 3A-9 and 10-12 are identified by the same reference numerals for clarity and simplicity. Furthermore, similar elements in FIGS. 3A-9 and 10-12 can include similar materials, and thus those details are omitted in the interest of brevity. In some embodiments of the present disclosure, a semiconductor assembly or a first semiconductor package 200' can be provided according to the method for forming the semiconductor assembly 10. The first semiconductor component 200' can be similar as the abovementioned first semiconductor component 200, and thus only the difference is detailed. Referring to FIG. 10, which is a bottom view of a substrate 202 provided according to operation 102. The substrate 202 can include a plurality of scribe line regions and a plurality of chip regions 206 defined by the scribe line regions. Semiconductor operations can be performed to the semiconductor wafer to form TSVs (not shown) in the substrate 202, an interconnect structure (not shown) over a surface of the substrate 202, and a plurality of connectors (not shown) over the surface of the substrate 202. At least one or more semiconductor devices 220 such as dies can be formed over the surface of the substrate 202. And any suitable combination of semiconductor dies and any number of semiconductor dies may be alternatively adopted, and all such numbers, combinations, and functionalities are fully intended to be included within the scope of the present disclosure. As mentioned above, the semiconductor devices 220 are bonded to the substrate 202 through the connectors. Underfill materials (not shown) can be dispensed into the space between the dies 220 and the substrate 202 and to surround the connectors. A molding compound 226 (shown in FIG. 12) is molded on the semiconductor devices 220 and followed by, in some embodiments, performing a planarization operation to provide a substantially planar top surface and expose top surface of the semiconductor devices 220.

Referring to FIG. 10, a plurality of connectors 230 is disposed in each chip region 206. The connectors 230 are disposed on a surface 202a opposite to the dies 220, and electrically coupled to the TSVs. In some embodiments of the present disclosure, a plurality of grooves 240 is formed in the scribe line regions according to operation 104 as shown by the dotted line in FIG. 10. The grooves 240 can be formed in a continuous manner on the scribe line region, such that the planar layout of the grooves 240 is substantially similar to that of the scribe line region. Accordingly, the grooves 240 are intersected to form a plurality of intersection regions 242 as shown in FIG. 10. In some embodiments, since the neighboring chip regions 206 are separated by the grooves 240 on the scribe line regions, the intersection regions 242 are adjacent to four corners of four different chip regions 206, as shown in FIG. 10.

Still referring to FIG. 10, a plurality of first stress buffer structures 250 is formed in the intersection regions 242 over the surface 202a according to operation 106. In some embodiments of the present disclosure, a plurality of second stress buffer structures 252 is formed in the grooves 240 over the surface 202a simultaneously. In some embodiments of the present disclosure, the first stress buffer structures 250 and the second stress buffer structures 252 can be formed by disposing a plurality of polymer materials over the grooves 240 and the intersection regions 242. As shown in FIG. 10, the grooves 240 and the intersection regions 242 are filled with the polymer materials. Furthermore, the polymer materials may overflow the grooves 240 and the intersection regions 242. Thus, a diameter D of one of the first stress buffer structures 250 and a width of the second stress structures 252 are greater than a width W of the grooves 240 after curing the polymer materials as shown in FIG. 10. And the first stress buffer structures 250 and the second buffer stress structures 252 may have a curved surface, respectively. In some embodiments, the first stress buffer structures 250 can include epoxy-based materials without fillers. In some embodiments, the first stress buffer structures 250 can include fillers in the epoxy-based materials. As shown in FIG. 10, the first stress buffer structures 250 and the second stress buffer structures 252 are spaced apart from the connectors 230. Furthermore, each of the second stress buffer structures 252 contacts and connects two adjacent first stress buffer structures 250. In other words, the first stress buffer structures 250 and the second stress buffer structures 252 are connected to each other form a stress buffer frame, as shown in FIG. 10.

Referring to FIG. 11, after disposing the first stress buffer structures 250 and the second stress buffer structures 252, the substrate 202 is cut along the grooves 240 from the surface 202a according to operation 108. Accordingly, the chip regions 206 of the substrate 202 are diced into a plurality of semiconductor assemblies 200', such as interposer chips. In some embodiments of the present disclosure, sine the individual semiconductor assemblies 200' include the die(s) 220 bonded to the interposer substrate 202, the semiconductor assemblies 200' can be referred to as die-on-interposer package components. In some embodiments, each of the first stress buffer structures 250 is cut into four portions remaining on the four corners of the substrate 202. Each of the second stress buffer structures 252 is cut into two portions remaining on the four edges of the substrate 202.

A cross-sectional view of the semiconductor assemblies 200' is shown in FIG. 12. Referring to FIG. 12, the semiconductor assembly 200' includes the first side 202a and the second side 202b. More importantly, the semiconductor assembly 200' includes a plurality of recessed corners 202C over the first side 202a and a plurality of recessed edges 202E over the first side 202a. Each of the recessed corners 202C is a part of the intersection region 242, and each of the recessed edges is a part of the groove 240. The dotted line near the connectors 230 represents a surface of the substrate 202 and openings of the recessed corners 202C and the recessed edges 202E. The dotted line near the die 220 represents bottoms of the recessed corners 202C and the recessed edges 202E. The slanted dotted lines connecting the above mentioned two dotted lines represent sidewalls of the recessed corners 202C and the recessed edges 202E. The semiconductor assembly 200' further includes the plurality of first stress buffer structures 250 disposed at the recessed corners 202C and the plurality of second stress buffer structures 252 disposed over the recessed edges 202E. The first stress buffer structures 250 respectively have a curved surface. Additionally, each of the first stress buffer structures includes two vertical sidewalls substantially align to corner sidewalls of the semiconductor assembly 200'. The second stress buffer structures 252 respectively have a curved surface. Additionally, each of the second stress buffer structures 252 includes a vertical sidewall substantially align to an edge sidewall of the semiconductor assembly 200' as shown in FIG. 12.

Referring to FIG. 12, in some embodiments of the present disclosure, a first package component such as the semiconductor assembly 200' is provided according to operation 110, and the first package component 200' is bonded to a second package component 260 with the first side 200a facing the second package component 260 according to operation 112. Such that second package component 260 is electrically coupled to the first package component 200' through the connectors 230 and connectors 262. In some embodiments of the present disclosure, since heights of the first stress buffer structures 250 and the second stress buffer structures 252 are less than the height of the connectors 230, the first stress buffer structures 250 and the second stress buffer structures 252 all are spaced apart from the second package component 260 as shown in FIG. 12.

Still referring to FIG. 12, an underfill material 264 is formed between the first package component 200' and the second package component 260 according to operation 114. Accordingly, a semiconductor package 270' is obtained. In some embodiments, at least a portion of the first stress buffer structures 250 and at least a portion of the second stress buffer structures 252 are in contact with and embedded in the underfill material 264. It can be understood that when the first stress buffer structures 250 includes no fillers, a portion of the curved surface of the first stress buffer structures 250 and a portion of the curved surface of the second stress buffer structures 252 are in contact with and embedded in the underfill material 264.

It will be appreciated that in the forgoing method, the first stress buffer structures are formed in the intersection regions of the grooves. In other words, the first stress buffer structures are formed at the recessed corners of the semiconductor assembly or the first semiconductor package component. As mentioned above, the corners often act as crack initial points, therefore by providing the first stress buffer structures at the recessed corners of the first package component, the stress is buffered, the crack initial point is eliminated, and thus the crack and delamination issues are mitigated.

According to one embodiment of the present disclosure, a method for forming a semiconductor assembly is provided. The method includes providing a substrate including a plurality of scribe line regions; forming a plurality of grooves in the scribe line regions, wherein the grooves are intersected to form a plurality of intersection regions; disposing a plurality of first stress buffer structures in the intersection regions, wherein a diameter of one of the first stress buffer structures is greater than a width of the grooves; and cutting along the grooves after disposing the first stress buffer structures.

According to another embodiment, a method for forming a semiconductor package is provided. The method includes providing a first package component comprising a first side and a second side opposite to the first side, wherein the first package component comprises a plurality of recessed corners on the first side and a plurality of first stress buffer structures disposed at the recessed corners; bonding the first package component to a second package component with the first side facing the second package component; and forming an underfill material between the first package component and the second package component, wherein at least a portion of the first stress buffer structures is in contact with and embedded in the underfill material.

According to one embodiment of the present disclosure, a semiconductor package is provided. The semiconductor package includes a first package component including a first side, a second side opposite to the first side, and a plurality of recessed corners over the first side; a plurality of first stress buffer structures disposed at the recessed corners, wherein each of the first stress buffer structures has a curved surface; a second package component connected to the first side of the first package component; a plurality of connectors disposed between the first package component and the second package component, and the connectors electrically coupling the first package component and the second package component; and an underfill material between the first package component and the second package component, wherein at least a portion of the curved surface of the first stress buffer structures is in contact with and embedded in the underfill material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor assembly, comprising;
   providing a substrate comprising a first surface, a second surface opposite to the first surface and a plurality of scribe line regions over the first surface, wherein at least a semiconductor device and a molding compound are disposed over the second surface;
   forming a plurality of grooves in the scribe line regions over the first surface, wherein the grooves are intersected to form a plurality of intersection regions;
   disposing a plurality of first stress buffer structures in the intersection regions, wherein a diameter of one of the first stress buffer structures is greater than a width of the grooves; and
   cutting along the grooves after disposing the first stress buffer structures.

2. The method of claim 1, wherein the substrate comprises a plurality of chip regions defined by the scribe line regions.

3. The method of claim 2, further comprising disposing a plurality of connectors in each chip region before disposing the first stress buffer structures.

4. The method of claim 3, wherein the first stress buffer structures are spaced apart from the connectors.

5. The method of claim 1, wherein the disposing the first stress buffer structures further comprises:
   disposing a plurality of polymer materials over the intersection regions; and
   curing the polymer materials to form the first stress buffer structures.

6. The method of claim 1, wherein the first stress buffer structures comprise epoxy-based materials.

7. The method of claim 6, wherein the first stress buffer structures comprise fillers in the epoxy-based materials.

8. The method of claim 1, further comprising disposing a plurality of second stress buffer structures in the grooves simultaneously with disposing the first stress buffer structures, and the second stress buffer structures contact the first stress buffer structures.

9. The method of claim 8, wherein a width of the second stress buffer structures is greater than the width of the grooves.

10. A method for forming a semiconductor assembly, comprising;
   receiving a semiconductor wafer comprising a first surface, a second surface opposite to the first surface and a plurality of chip regions and scribe line regions spacing apart individual chip regions over the first surface, wherein at least a semiconductor device and a molding compound are disposed over the second surface;
   forming a plurality of grooves in the scribe line regions over the first surface, wherein the grooves are intersected to form a plurality of intersection regions;
   disposing a plurality of first stress buffer structures at the intersection regions, wherein a diameter of one of the first stress buffer structures is greater than a width of the grooves; and
   cutting through one of the first stress buffer structures by cutting along the grooves.

11. The method of claim 10, further comprising disposing a plurality of connectors in one of the chip regions before forming a plurality of grooves in the scribe line regions.

12. The method of claim 10, further comprising disposing a plurality of second stress buffer structures in the grooves simultaneously with disposing the first stress buffer structures, and the second stress buffer structures contact the first stress buffer structures.

13. The method of claim 10, wherein forming the plurality of grooves in the scribe line regions comprises a bevel cutting operation.

* * * * *